(12) United States Patent
Laufkötter

(10) Patent No.: US 8,081,092 B2
(45) Date of Patent: Dec. 20, 2011

(54) METHOD FOR ENTERING CHARACTERS ON A KEYBOARD AND A KEYBOARD

(75) Inventor: Dieter Laufkötter, Bad Wünnenberg (DE)

(73) Assignee: Siemens Enterprise Communications GmbH & Co. KG, Munich (DE)

( * ) Notice: Subject to any disclaimer, the term of this patent is extended or adjusted under 35 U.S.C. 154(b) by 867 days.

(21) Appl. No.: 11/663,365

(22) PCT Filed: Sep. 2, 2005

(86) PCT No.: PCT/EP2005/054336
§ 371 (c)(1),
(2), (4) Date: Mar. 20, 2007

(87) PCT Pub. No.: WO2006/034941
PCT Pub. Date: Apr. 6, 2006

(65) Prior Publication Data
US 2008/0100477 A1    May 1, 2008

(30) Foreign Application Priority Data
Sep. 27, 2004    (DE) .......................... 10 2004 046 857

(51) Int. Cl.
*H03K 17/94* (2006.01)
(52) U.S. Cl. ................ 341/23; 341/20; 341/22; 341/26; 341/29
(58) Field of Classification Search ..................... 341/23, 341/22, 20, 26, 29
See application file for complete search history.

(56) References Cited

U.S. PATENT DOCUMENTS

| | | | | |
|---|---|---|---|---|
| 4,381,502 A * | 4/1983 | Prame | ............................ | 341/26 |
| 4,768,144 A * | 8/1988 | Winter et al. | ........................ | 1/1 |
| 4,988,997 A * | 1/1991 | Prame | .............................. | 341/25 |
| 5,336,002 A | 8/1994 | Russo | | |
| 5,574,447 A | 11/1996 | Roylance | | |
| 5,675,329 A * | 10/1997 | Barker et al. | .................... | 341/22 |
| 6,198,474 B1 | 3/2001 | Roylance | | |
| 6,278,384 B1 * | 8/2001 | Ide | .................. | 341/26 |
| 6,320,519 B1 | 11/2001 | Hsu et al. | | |
| 7,088,341 B2 * | 8/2006 | Koch et al. | ..................... | 345/169 |
| 7,104,711 B2 * | 9/2006 | Kurriss | ......................... | 400/486 |
| 7,113,172 B2 * | 9/2006 | Hohl et al. | ..................... | 345/169 |
| 7,362,243 B2 * | 4/2008 | Kandogan et al. | ............... | 341/22 |
| 7,453,376 B2 * | 11/2008 | de Brebisson | .................. | 341/24 |
| 7,574,183 B2 * | 8/2009 | McKay | ....................... | 455/158.5 |
| 7,627,110 B2 * | 12/2009 | Mow | ................................ | 379/368 |
| 7,649,478 B1 * | 1/2010 | Yoon | .................................. | 341/22 |
| 2001/0013859 A1 | 8/2001 | Roylance | | |
| 2002/0175834 A1 * | 11/2002 | Miller | ............................... | 341/22 |
| 2003/0025618 A1 * | 2/2003 | Burrell | ............................. | 341/23 |
| 2003/0206157 A1 | 11/2003 | Emerson | | |
| 2005/0057521 A1 * | 3/2005 | Aull et al. | ...................... | 345/172 |

\* cited by examiner

Primary Examiner — Brian Zimmerman
Assistant Examiner — Amine Benlagsir

(57) ABSTRACT

In one aspect, a method for entering characters on a keyboard comprising a first character key, e.g. the space bar, to which a first character, e.g. a blank space is assigned and a second key, to which a second character, e.g. q and a third character, e.g. @ are assigned is provided. Accordingly, when the first character key is depressed, a timer is started. Before the time has run out and whilst the first character key is depressed, the second key can be pressed to obtain the third character. Before the time has run out, and before the second key is depressed, if the first character key is released, the first character is obtained. Once the timer has run out and the first character key has been released, if the second key is depressed, the second character is obtained.

21 Claims, 1 Drawing Sheet

METHOD FOR ENTERING CHARACTERS ON A KEYBOARD AND A KEYBOARD

CROSS REFERENCE TO RELATED APPLICATIONS

This application is the US National Stage of International Application No. PCT/EP2005/054336, filed Sep. 2, 2005 and claims the benefit thereof. The International Application claims the benefits of German application No. 102004046857.5 DE filed Sep. 27, 2004, both of the applications are incorporated by reference herein in their entirety.

FIELD OF INVENTION

The present invention relates to a method for entering characters on a keyboard and a keyboard.

BACKGROUND OF INVENTION

Depending on their national characteristics, keyboards use different Meta keys such as the Shift, Ctrl, Alt and Alt-Gr key to output different characters which are assigned to a second key occupied by more than one character. The respective Meta key and the respective second key are depressed at the same time to obtain such characters. A character in this context is taken to mean all characters to which a character code is assigned. Characters in what is known as the ASCII (American Standard Code for information Interchange) code are for example characters such as "a", "B", "+", "_", but also non-visible characters such as the character which is assigned to a delete key for example.

SUMMARY OF INVENTION

Whereas a standard computer keyboard has two Shift keys and two Ctrl keys, allowing operation with either the left or the right hand, and thereby fluid typing in the ten-finger system, this is not the case with all Meta keys. For example, in a German keyboard arrangement, the Alt-Gr key is only on the right-hand side of the keyboard, usually operated with the right hand. The outstanding feature of the ten-finger system is to allow the Meta key to be operated with one hand while the other hand depresses the respective second key. The result is that, in the ten-finger system, fluid typing is only possible with characters for which the respective Meta key required and the respective second can be operated with different hands. On the German keyboard this is not the case for key "{" for example, since this character is output by simultaneously depressing the key assigned to the character "7" and the Alt-Gr key, and both keys are arranged on the side of the keyboard usually operated with the right hand. This means that fluid typing of the character "{" is rendered very difficult, since either the left hand must leave its usual position or the right hand must depress the two keys simultaneously.

A further disadvantage of a number of previously widely-used Meta keys is that they are relatively small and thus not easy to find with the fingers. This is the case for example with the Alt-Gr key and the right Ctrl key on laptop computers.

Frequently the arrangement of the keys is also not optimized for specific applications on a conventional keyboard. Thus for example the keys "{" and "}" are part of the syntax descriptions of different programming languages such as C or Java, and are therefore frequently used in programs which are implemented in these programming languages. On the German keyboard these characters are output by simultaneously depressing the Alt-Gr key and the "7" or "0" key. Since both keys to be depressed are located in the area of the keyboard assigned to the right hand, fluid input of these characters is rendered more difficult.

In many situations only one hand is available for entering characters, e.g. if a telephone handset or a computer mouse is being operated with the other hand. In these cases it is necessary to press the Meta key and the second key simultaneously with one hand. With specific keyboard arrangements this can only be done with difficulty. An example of this is entering the "@" character on a German keyboard arrangement, which requires the Alt-Gr key and the "Q" key to be depressed simultaneously. These keys are usually so far apart however as to make them difficult, or even impossible to depress using one hand.

An object of the present invention is to simplify the entry of characters which were previously output by simultaneously pressing a Meta key and a second key.

This object is achieved as described in the independent claims.

In the inventive method for entering characters on a keyboard, a first character key, to which a first character is assigned, is first depressed. The first character key can for example be a space key with assigned space character, a Return key, function key, cursor key or also another key which is easily reached or able to be reached with either hand in the ten-finger system. In accordance with the invention, depressing the first character key causes a timer to start.

If a second key, to which a second and a third character are assigned, e.g. the key to which the character "7" is assigned as the second character and "{" as third character, is depressed before the timer runs out and the first character key is released, the third character is output.

If the first character key is released before the timer runs out and the second key is depressed, the first character is output.

If the second key is depressed after the timer runs out and the first character key is released, this causes the second character to be output.

The inventive method allows a third character assigned to a second key with multiple character labels to be output without the second key having to be pressed in conjunction with a Meta key frequently not accessible with both hands in the ten-finger system.

This considerably simplifies typing the full range of characters in the ten-finger system, especially if a key positioned centrally on the keyboard, for example the space bar, which can be easily reached with both hands is used as the first character key. In such a case the first character key and the second key can generally be reached with different hands in the ten-finger system, so that a simultaneous depression of both keys with one hand, which impedes the flow of typing, can mostly be avoided.

Regardless of this, when a key positioned centrally on the keyboard is used as the first key, the depression of this first character key and the second keys with one hand is at least facilitated.

A further significant advantage of the method in accordance with the invention can be seen in the fact that no additional keys are required and thereby commercially available keyboards can be used.

Advantageous embodiments of the invention are specified in the dependent claims.

According to one advantageous embodiment of the invention a release of the first character key can have the same effect as the timer running out. This means that it is not necessary to first wait for the timer to run out before entry of further characters.

In accordance with a further development of the invention the second key can be assigned a fourth character, e.g. "#", and a further character key to which a further character is assigned can be provided. A space key with an assigned space character, a Return key, function key, cursor key or any other key that is easy to reach or reachable with both hands can be the further key. In this case depressing the further character key can cause a further timer, which can also be identical to the first timer, to be started. Before the further timer runs out and the further character key is released, depressing the second key can cause the fourth character to be output. Before the further timer runs out and the second key is depressed, releasing the further character key can cause the further character to be output. After the further timer runs out and the further character key is released, depressing the second key can cause the second character to be output.

An advantageous embodiment of the invention can be designed so that the same character is assigned to the two character keys. For example two space keys can be arranged on the keyboard which, when depressed once, output the space character in each case. When the first space key and the second key, e.g. key "Q" are depressed, the third character, e.g. "@", can be output, whereas if the second space key and the same second key are depressed, a fourth character different from the third character, e.g. "#", can be output.

In accordance with a further embodiment of the invention, before the timer runs out and release of the first character key, if the second key is depressed, a second timer which is possibly identical to the first timer is started. After the second timer runs out, the third character can then be repeatedly output. This corresponds to the usual repeat function which is activated if a key is held down. The invention enables such a repeat function to also be activated for characters able to be output by depressing a character key and a second key.

According to a further advantageous embodiment of the invention, there can be provision, after the first character key or the second key is released, for a third timer to be started. This third timer can for example be identical to the first and/or second timer. If the first character key is now still depressed when the third timer runs out, the first character can be repeatedly output. If on the other hand the second key is still depressed when the third timer runs out, the second character is repeatedly output.

This corresponds to a repeat function activated when a key is held down.

Furthermore a release of both depressed keys before the third timer runs out can cause the third timer to end. This means that the user need not wait until the timer has run out, but can continue to enter characters.

BRIEF DESCRIPTION OF THE DRAWINGS

An exemplary embodiment of the invention is explained in more detail below with reference to a drawing.

DETAILED DESCRIPTION OF INVENTION

Figure 1:
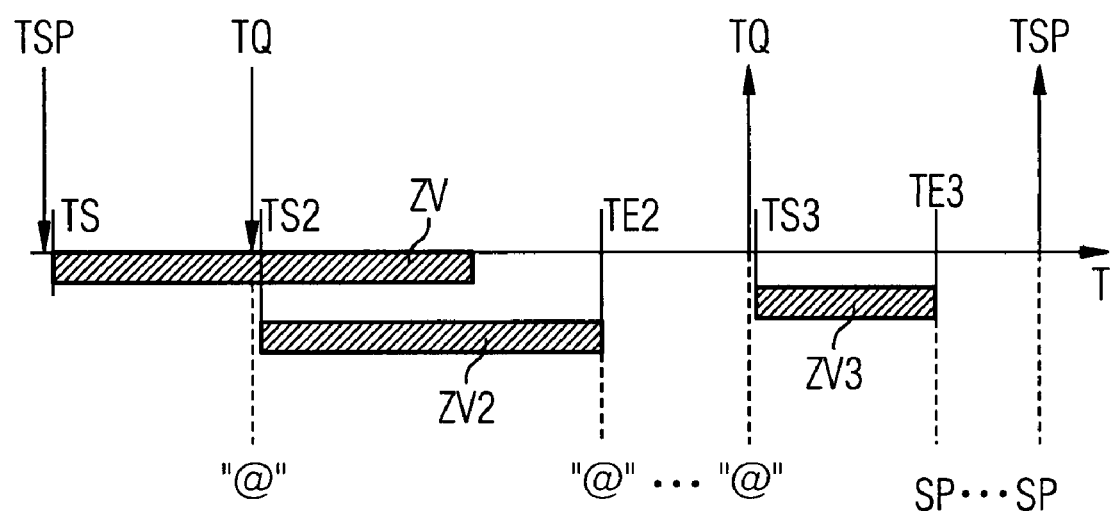
FIGS. 1 and 2 here each show schematic diagrams of a flow diagram to illustrate the chronological execution sequence of keyboard actuations.
Figure 2:
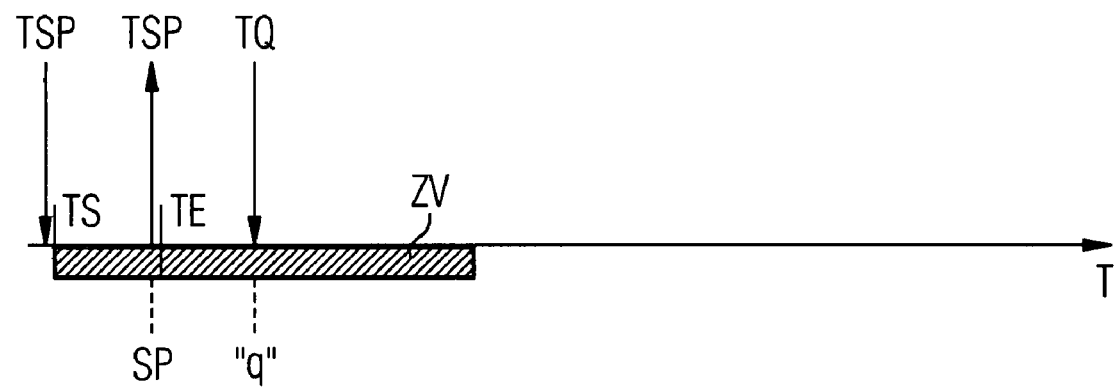

FIGS. 1 and 2 each show a schematic flow diagram to illustrate the chronological execution sequence of keyboard actuations with a horizontal time axis T directed to the right. Depressing a respective key is shown by a downwards vertical arrow, releasing a respective key by an upwards vertical arrow. Below the time axis a dotted line shows the character output at a particular point in time or during a particular period.

In the present exemplary embodiment the space key is preferably provided as a first character key TSP. The key "Q" of a commercially available keyboard is used for example as a second key TQ. The first character key TSP is assigned the space character as first character SP and the second key TQ the character "q" as second character and the character "@" as third character.

FIG. 1 shows an inventive method sequence in which space key TSP is depressed to begin with. At a time TS this starts a first timer with a preset time ZV shown by a cross-hatched bar. If after the space key TSP is depressed, the key TQ is depressed before the first timer runs out, this outputs the character "@" and a second timer is started at point TS2 with a preset time ZV2.

According to an advantageous exemplary embodiment this depression of key TQ before the timer runs out can cause the timer to end prematurely (not shown in the drawing). In this case the second timer can be identical to the first timer.

If the depressed key TQ is released before the second timer runs out, this can cause the second timer to be ended prematurely (not shown in the drawing). If on the other hand the second timer runs out before the key TQ is released at a point in time illustrated by a short vertical line TE2, the character "@" is repeatedly output. This corresponds to a repeat function activated when a key is held down. The repeated character output is ended by releasing key TQ. This release causes a further timer to be started at a point in time TS3 with preset time ZV3—shown in FIG. 1 by a short vertical line. After the further timer runs out at a point in time TE3, illustrated by a short vertical line, the space character SP is now repeatedly output. This again corresponds to a repeat function which is activated when a key is held down. Releasing the space key TSP ends the output of the space character SP.

FIG. 2 shows method sequence in which the keys are activated in a different order to that shown in FIG. 1. At the beginning of the execution sequence the space key TSP is depressed, which starts a timer at time TS with a preset time ZV illustrated by a cross-hatched bar. If—unlike in FIG. 1—the key TSP is released before the timer runs out, the character SP is output and the timer is caused to end prematurely at a point in time TE illustrated by a short vertical line. If after the release of the space key SP the key TQ is depressed, this causes the second character "q" to be output.

The method sequence shown in FIG. 2 differs from a conventional character output especially in that the character SP assigned to the first character key TSP is not output when the first character key TSP is depressed but only once this character key TSP is released.

The invention claimed is:

1. A method for entering characters on a keyboard, the keyboard comprising a first key to which a first character is assigned, a second key to which a second character and a third character are assigned, the third character being different than the second character, the method comprising:
  activating a first timer in response to a depression of the first key, the first timer terminating after a first time period or a release of the first key;
  activating a second timer in response to a depression of the second key while the first key is still depressed and the first timer is active, the second timer terminating after a second time period;
  while the first key is still depressed, the first timer is active, and the second timer is active:
    outputting the third character in response to the depression of the second key;
  repeatedly outputting the third character after terminating the second timer while the second key is depressed;
  activating a third timer upon a release of the second key while the first key is still depressed; and
  terminating the third timer after a predetermined amount of time while the first key is still depressed and outputting the first character after the third timer is terminated, the first character not being outputted while the third timer is active.

2. The method as claimed in claim 1, wherein outputting of the second key ends upon release of the second key.

3. The method as claimed in claim 1, further comprising outputting the first character repeatedly following termination of the third timer while the first key is depressed.

4. The method as claimed in claim 3, wherein outputting of the first character ends upon release of the first key.

5. The method as claimed in claim 1, wherein the first character assigned is a blank space, the second character assigned is the letter q, and the third character assigned is the symbol @.

6. The method as claimed in claim 1, wherein the second key is also assigned a fourth character and the keyboard further comprising a further character key to which a further character is assigned, the method further comprising:
 depressing the further key;
 activating a further timer that terminates after a further time period or a release of the further key;
 while the further timer is active:
  outputting the fourth character in response to a depression of the second key while the further character key is depressed, and
  outputting the further character in response to a release of the further character key prior to a depression of the second key; and
 after the further timer has terminated:
  outputting the second character in response to a release of the further key followed by a depression of the second key.

7. The method as claimed in claim 6, wherein the first character and the further character assigned to the further character key are identical, and the third character and the fourth character are different.

8. The method as claimed in claim 6, wherein the first and further time periods are different or wherein the first and further time periods are the same.

9. The method as claimed in claim 1, wherein the first character is not output upon a depression of the first key.

10. The method as claimed in claim 9, further comprising outputting the first character upon a release of the first key.

11. A computer device having a keyboard for entering characters on the keyboard, the keyboard comprising a first key to which a first character is assigned, a second key to which a second character and a third character are assigned, the third character being different than the second character, the computer device comprising:
 a first timer that activates in response to a depression of the first key, the first timer terminating after a first time period or a release of the first key;
 a second timer that activates in response to a depression of the second key while the first key is still depressed and the first timer is active, the second timer terminating after a second time period;
 the third character being output in response to a depression of the second key while the first key is still depressed, the first timer is active, and the second timer is active;
 the third character being repeatedly output after the second timer terminates and the second key is depressed;
 a third timer that activates in response to a release of the second key while the first key is still depressed; and
 the third timer terminating after a predetermined amount of time while the first key is still depressed, the first character not being output while the third timer is active and the first character being output after termination of the third timer.

12. The computer device as claimed in claim 11, wherein the second key stops outputting upon release of the second key.

13. The computer device as claimed in claim 11, wherein the first character is repeatedly output following termination of the third timer while the first key is depressed.

14. The computer device as claimed in claim 13, wherein the first character stops outputting upon release of the first key.

15. The computer device as claimed in claim 11, wherein the first character assigned is a blank space, the second character assigned is the letter q, and the third character assigned is the symbol @.

16. The computer device as claimed in claim 11, wherein the second key is also assigned a fourth character and the keyboard further comprising a further character key to which a further character is assigned, the computer device further comprising:
 a further timer that activates in response to a depression of the further key, the further timer terminates after a further time period;
 while the further timer is active:
  the fourth character being output in response to a depression of the second key while the further character key is depressed, and
  the further character being output in response to a release of the further character key prior to a depression of the second key; and
 after the further timer has terminated:
  the second character being output in response to a release of the further key followed by a depression of the second key.

17. The computer device as claimed in claim 16, wherein the first character and the further character assigned to the further character key are identical, and the third character and the fourth character are different.

18. The computer device as claimed in claim 16, wherein the first and further time period are different or wherein the first and further time period are the same.

19. The computer device as claimed in claim 11, wherein the first character is not output upon a depression of the first key.

20. The computer device as claimed in claim 19, wherein the first character being output upon a release of the first key.

21. The A method for entering characters on a keyboard, the keyboard comprising a first key to which a first character is assigned, a second key to which a second character and a third character are assigned, the third character being different than the second character, the method comprising:
 activating a first timer in response to a depression of the first key, the first timer terminating after a first time period or a release of the first key;
 activating a second timer in response to a depression of the second key while the first key is still depressed and the first timer is active, the second timer terminating after a second time period;
 while the first key is still depressed, the first timer is active, and the second timer is active:
  outputting the third character in response to the depression of the second key;
 activating a third timer upon a release of the second key while the first key is still depressed; and
 terminating the third timer after a predetermined amount of time while the first key is still depressed and outputting the first character after the third timer is terminated.

* * * * *